(12) United States Patent
Yoshihara et al.

(10) Patent No.: US 8,174,293 B2
(45) Date of Patent: May 8, 2012

(54) TIME TO DIGITAL CONVERTER

(75) Inventors: Yoshiaki Yoshihara, Kanagawa (JP);
Hiroyuki Kobayashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/721,177

(22) Filed: Mar. 10, 2010

(65) Prior Publication Data

US 2010/0295590 A1 Nov. 25, 2010

(30) Foreign Application Priority Data

May 21, 2009 (JP) ................................. 2009-123327

(51) Int. Cl.
*H03B 21/00* (2006.01)
(52) U.S. Cl. ......... 327/107; 327/115; 327/117; 375/376
(58) Field of Classification Search .................. 327/107, 327/115, 117; 375/376
See application file for complete search history.

(56) References Cited

U.S. PATENT DOCUMENTS 6,593,773 B2 * 7/2003 Staszewski et al. ............. 326/46
6,826,247 B1 * 11/2004 Elliott et al. ................... 375/376

OTHER PUBLICATIONS

Staszewski, et al. All-Digital Frequency Synthesizer in Deep-Submicron CMOS, Wiley, New York, 2006, pp. 91-94.

* cited by examiner

*Primary Examiner* — Lincoln Donovan
*Assistant Examiner* — John Poos
(74) *Attorney, Agent, or Firm* — Turocy & Watson, LLP

(57) ABSTRACT

A time to digital converter includes: a delay circuit having a plurality of delay stages that delay an input clock signal in multiple stages, at least one of the delay stages being a variable delay stage; a plurality of flip flops that capture outputs of the delay stages corresponding thereto in a one-to-one relation in response to input of a reference signal; an edge detecting circuit that detects changing edges of respective outputs of the flip flops; a counter circuit that counts a number of edges detected by the edge detecting circuit; and a control circuit that controls a delay amount of the variable delay stage according to the number of edges counted by the counter circuit.

12 Claims, 5 Drawing Sheets

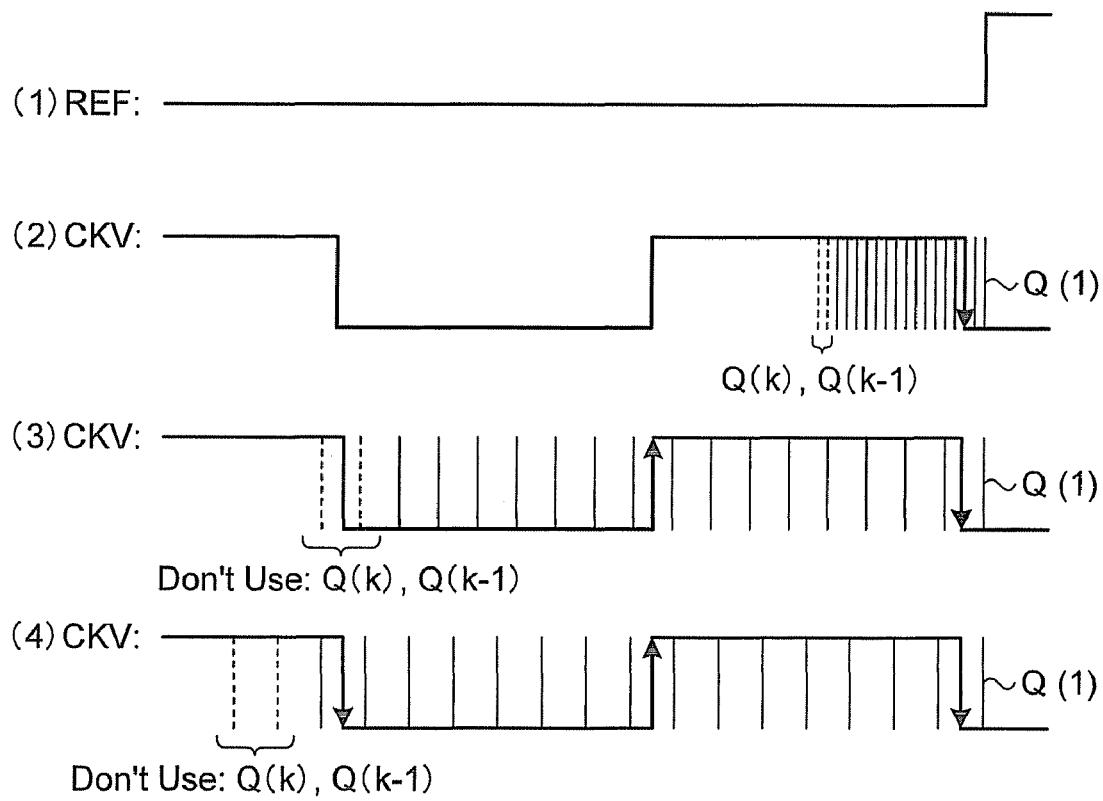

TIME TO DIGITAL CONVERTER

CROSS-REFERENCE TO RELATED APPLICATIONS

This application is based upon and claims the benefit of priority from the prior Japanese Patent Application No. 2009-123327, filed on May 21, 2009; the entire contents of which are incorporated herein by reference.

BACKGROUND OF THE INVENTION

1. Field of the Invention

The present invention relates to a time to digital converter.

2. Description of the Related Art

A time to digital converter (hereinafter, "TDC") is a device that performs measurement of decimal fraction time. In recent years, TDCs having accuracy of nano-second order to pico-second order can be easily realized by a CMOS circuit technology. An application range of the TDCs is extended to various fields. As one of applications of the TDCs, for example, as described in R. B. Staszewski and P. T. Balasare, "All-Digital Frequency Synthesizer in Deep-Submicron CMOS", Wiley, New York, 2006, an all digital PLL (ADPLL) that is fully digitized by incorporating a TDC in a phase locked loop (hereinafter, "PLL"), digitization of which is advanced, is developed. The ADPLL has advantages that, for example, control of an operation state is easy, an analog loop filter is unnecessary, and an occupied area can be reduced by microminiaturization of a process.

The TDC used in the ADPLL captures outputs in respective delay stages of a delay circuit, to which an output signal of a digitally controlled oscillator (hereinafter, "DCO") is input, in synchronization with a reference signal to convert a decimal fraction phase difference (time data) between a period of the output signal of the DCO and the reference signal into a digital code.

The ADPLL proposed in the past is assumed to be used in a radio circuit. An output frequency of the DCO is as high as several gigahertz order. Therefore, the TDC that detects decimal fraction phase information is used to set delay time to as short fixed time as possible and realize high time resolution of several pico-seconds.

However, the technology of the ADPLL proposed in the past does not indicate a clear guideline concerning a method of deciding the number of delay stages and delay time necessary for obtaining periodic data. Therefore, adjustment work for delay time of the TDC performed to acquire periodic data for each of DCOs in use is extremely bothersome.

For example, when it is attempted to apply a TDC to a low-frequency PLL such as a baseband PLL, if delay time of the TDC used in the ADPLL proposed in the past is applied to delay time of the TDC, it is necessary to increase the number of delay stages of the TDC to acquire periodic data of a low-frequency signal. Then, power consumption unnecessarily increases.

On the other hand, to prevent the problem, if a method of increasing a time delay amount of the delay stages of the delay circuit and acquiring periodic data of the low-frequency signal without increasing the number of delay stages of the delay circuit is adopted, when the time delay amount is too large, a waveform is dulled and the periodic data cannot be accurately acquired. As a result, a functional operation failure and a fall in resolution are caused.

SUMMARY OF THE INVENTION

According to one aspect of the present invention, a time to digital converter includes a delay circuit having a plurality of delay stages that delay an input clock signal in multiple stages, at least one of the delay stages being a variable delay stage; a plurality of flip flops that are provided in a number same as a number of the delay stages of the delay circuit and capture outputs of the delay stages corresponding thereto in parallel in response to input of a reference signal; an edge detecting circuit that detects one or both of rising edges and falling edges of respective outputs of the flip flops; a counter circuit that counts a number of edges detected by the edge detecting circuit; and a control circuit that controls a delay amount of the variable delay stage according to the number of edges counted by the counter circuit.

According to one aspect of the present invention, a time to digital converter includes a delay circuit having a plurality of delay stages that delay an input clock signal in multiple stages, at least one of the delay stages being a variable delay stage; a plurality of flip flops that are provided in a number same as a number of the delay stages of the delay circuit and capture outputs of the delay stages corresponding thereto in parallel in response to input of a reference signal; an edge detecting circuit that detects, without using an output signal of at least one flip flop from a final stage of the flip flops, one or both of rising edges and falling edges of respective outputs of the remaining flip flops; a counter circuit that counts a number of edges detected by the edge detecting circuit; and a control circuit that controls a delay amount of the variable delay stage according to the number of edges counted by the counter circuit.

BRIEF DESCRIPTION OF THE DRAWINGS

FIG. 9 is a timing chart for explaining an optimization process for delay time by a procedure shown in FIG. 8.

DETAILED DESCRIPTION OF THE INVENTION

Exemplary embodiments of the present invention are explained in detail below with reference to the accompanying drawings. The present invention is not limited by the embodiments.

Figure 1:
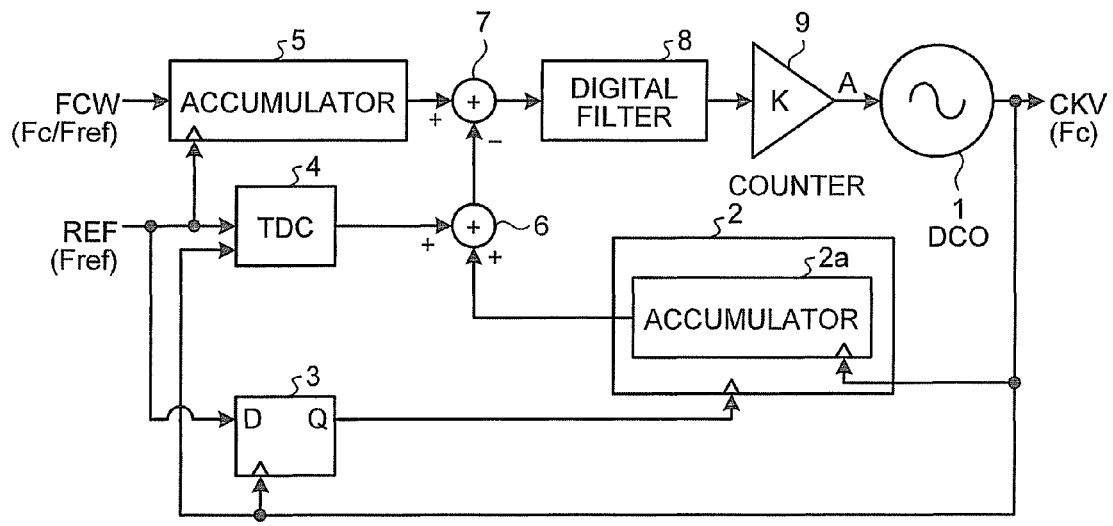
FIG. 1 is a block diagram illustrating the basic configuration of a full-digital PLL to which a time to digital converter according to the present invention can be applied.

FIG. 1 is a block diagram illustrating the basic configuration of a full-digital PLL to which a time to digital converter according to the present invention can be applied. The time to digital converter according to the present invention is not limited to the application to an ADPLL. However, in this embodiment, for convenience of explanation, it is assumed that the time to digital converter is used in phase detection of the ADPLL. Therefore, to facilitate understanding, first, the ADPLL is briefly explained with reference to FIG. 1.

The ADPLL shown in FIG. 1 includes a digitally controlled oscillator (DCO) 1, a counter 2, a flip flop 3 as a retiming circuit, a time to digital converter (TDC) 4, an accumulator 5, adders 6 and 7 forming a digital phase comparator, a digital filter 8 functioning as a loop filter, and a gain corrector 9.

The DCO 1 outputs a clock signal CKV having a frequency Fc indicated by a control code A from the gain corrector 9. The flip flop 3 captures a reference signal REF, which is input from the outside to a data input terminal D, in synchronization with the clock signal CKV output by the DCO 1 and outputs the synchronized reference signal REF from a data output terminal Q.

The counter 2 includes an accumulator 2a that integrates the frequency of the clock signal CKV output by the DCO 1. The counter 2 outputs an integration value of the accumulator 2a at the time of input of the reference signal REF, which synchronizes with the clock signal CKV output by the flip flop 3, to one addition input terminal of the adder 6.

The TDC 4 includes a delay circuit that delays the output clock signal CKV of the DCO 1 in multiple stages, a plurality of flip flops that capture outputs of the delay stages of the delay circuit in synchronization with the reference signal REF, and a circuit that generates phase information equal to or smaller than one period of the clock signal CKV from an output state of the flip flops. The TDC 4 outputs the generated phase information equal to or smaller than one period to the other addition input terminal of the adder 6.

The adder 6 adds up the integration value from the counter 2 and the phase information equal to or smaller than one period from the TDC 4 with the integration value set as an integer part and the phase information set as a decimal part. An addition result of the adder 6 is given to a subtraction input terminal of the adder 7 as phase information standardized by a frequency Fref of the reference signal REF. An output of the accumulator 5 is input to an addition input terminal of the adder 7.

A ratio "Fc/Fref" of an oscillation frequency Fc of the DCO 1 as a frequency control word FCW and the frequency Fref of the reference signal REF is input to the accumulator 5 from the outside. The reference signal REF is also input to the accumulator 5. The accumulator 5 time-integrates the ratio "Fc/Fref" and converts the ratio "Fc/Fref" into phase information. The accumulator 5 outputs the phase information, which is obtained at the time when the reference signal REF is input, to the addition input terminal of the adder 7 as phase control information.

The adder 7 performs subtraction between the phase control information from the accumulator 5 and the phase information from the adder 6 and generates phase error information. The digital filter 8 as a loop filter applies low-pass processing to the phase error information output by the adder 7 and generates a control value for the DCO 1. The gain corrector 9 multiplies the control value generated by the digital filter 8 with a coefficient K and generates a control code A obtained by correcting a frequency gain for the control value of the DCO 1. According to repetition of the above processing, when the ratio "Fc/Fref" is represented as n, the oscillation frequency of the DCO 1 is controlled such that Fc=n×Fref holds.

Figure 2:
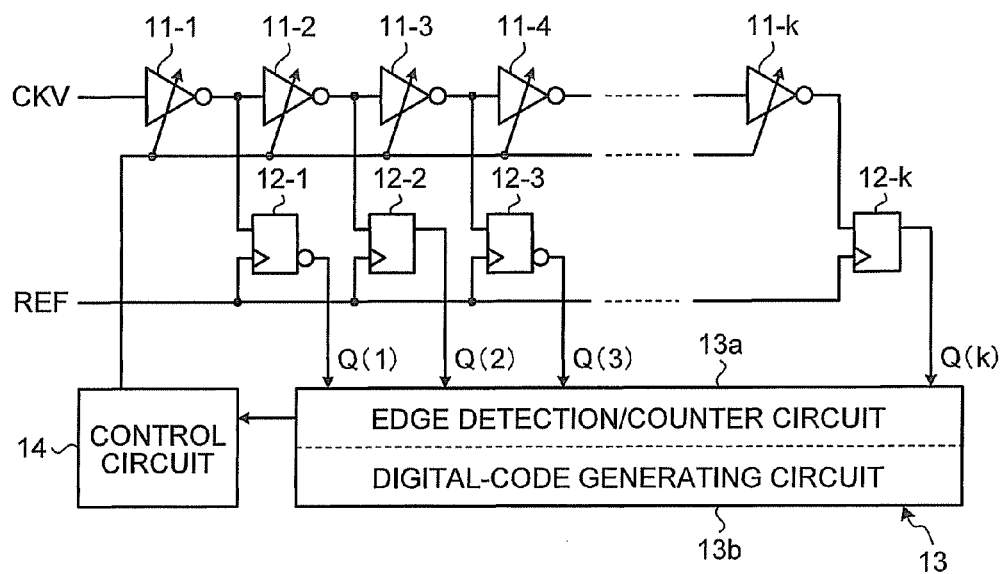
FIG. 2 is a block diagram illustrating the configuration of a time to digital converter according to a first embodiment of the present invention.

FIG. 2 is a block diagram illustrating the configuration of a time to digital converter (TDC) according to a first embodiment of the present invention. In FIG. 2, a TDC according to this embodiment includes a plurality of variable delay circuits 11-1 to 11-k connected in series, a plurality of flip flops 12-1 to 12-k provided in a one-to-one relation with the variable delay circuits 11-1 to 11-k, an edge detection/counter circuit 13a, and a control circuit 14.

As the variable delay circuits 11-1 to 11-k, because a delay amount only has to be variable, widely-known variable delay circuits only have to be selected and used as appropriate. Because the variable delay circuits 11-1 to 11-k are shown in FIG. 2 as inverter circuits, a configuration example formed by a CMOS inverter circuit is shown in FIG. 3.

Figure 3:
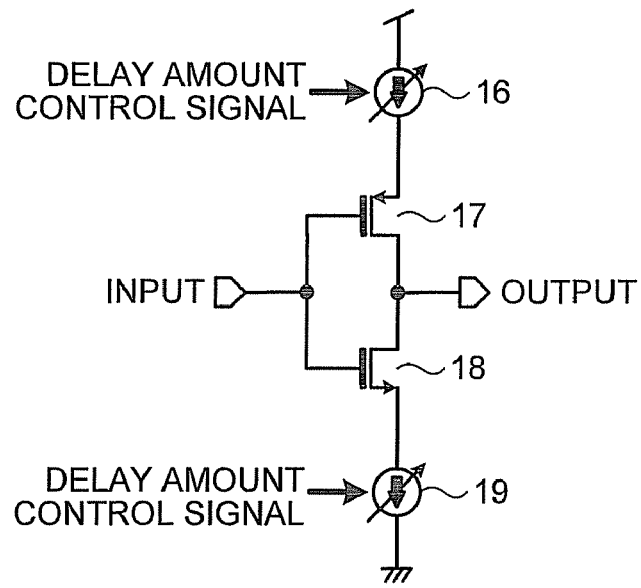
FIG. 3 is a circuit diagram illustrating a configuration example of a variable delay circuit shown in FIG. 2.

FIG. 3 is a circuit diagram illustrating a configuration example of the variable delay circuit shown in FIG. 2. In FIG. 3, in a PMOS transistor 17 and an NMOS transistor 18 connected in series, gates are connected in common to form an input terminal and drains are connected in common to form an output terminal. The PMOS transistor 17 and the NMOS transistor 18 configure a CMOS inverter circuit that inverts and outputs an input. A variable current source 16 is provided between a source of the PMOS transistor 17 and a power supply. A variable current source 19 is provided between a source of the NMOS transistor 18 and a circuit ground. The variable current sources 16 and 19 respectively supply operation working currents, which correspond to a delay amount control signal from the control circuit 14, to the CMOS inverter circuit. Consequently, signal transmission time between an input and an output of the CMOS inverter circuit is controlled according to the delay amount control signal from the control circuit 14.

As it is understood from the configuration shown in FIG. 2, the TDC according to this embodiment is a TDC obtained by changing, in the TDC used in phase detection of the ADPLL in the past, the delay stages of the delay circuits to variable delay stages, adding a counter circuit to an edge detecting circuit included in a thermometer circuit 13 to form the edge detection/counter circuit 13a, and adding the control circuit 14. In the thermometer circuit 13, the incorporated edge detecting circuit detects changes (edges) in outputs of the flip flops 12-1 to 12-k at the time when the reference signal REF is input. A digital-code generating circuit 13b generates a digital code, which is data for one period, based on an output of the detection. The digital code generated by the digital-code generating circuit 13b is called thermometer code.

An output CKV of the DCO 1 is input to the variable delay circuit 11-1 in the first stage of the variable delay circuits 11-1 to 11-k. The flip flops 12-1 to 12-k capture, in response to the reference signal REF input in common to clock input terminals thereof, outputs of the delay stages of the variable delay circuits 11-1 to 11-k and outputs the outputs to the edge detection/counter circuit 13a.

The edge detection/counter circuit 13a detects one or both of rising edges and falling edges of output signals of the flip flops 12-1 to 12-k and counts one or both of the rising edges and the falling edges. In FIG. 2, the variable delay circuits 11-1 to 11-k are shown as inverter circuits. Therefore, as data output terminals of the flip flops 12-1 to 12-k, negative-phase output terminals and positive-phase output terminals are alternately connected to the edge detection/counter circuit 13a.

The control circuit 14 controls to increase or decrease delay amounts in the variable delay circuits 11-1 to 11-k to be the same amount according to the number of edges detected by the edge detection/counter circuit 13a such that a right amount of data for one period can be acquired.

If the control circuit 14 is configured to perform the delay amount control until the edge detection/counter circuit 13a detects two or less edges, in some case, the data for one period cannot be acquired depending on a phase relation with the reference signal REF. On the other hand, when the control circuit 14 is configured to perform the delay amount control until the edge detection/counter circuit 13a detects three or more edges, the data for one period can be acquired. However, if the number of edges is too large, because there are a large number of data not in use, as a result, the resolution of the TDC falls.

Therefore, for example, assuming that an optimum value of the number of edges used for the delay amount control is three, the control circuit 14 causes the edge detection/counter circuit 13a to detect and count both rising edges and falling edges of output signals of the flip flops 12-1 to 12-k. When the number of edges is equal to or smaller than two, because a delay amount is small, the control circuit 14 performs control for increasing the delay amount at each unit time. When the number of edges is equal to or larger than three, because a delay amount is large, the control circuit 14 performs control for reducing the delay amount at each unit time. When three edges are detected, the control circuit 14 can end the delay amount control and keep a delay amount at that point.

Consequently, for example, when a delay amount changes because of fluctuation or the like or when an output frequency of the DCO 1 changes, delay time of the delay circuits can be controlled to an optimum value. Therefore, it is possible to prevent a functional operation failure from being caused.

As explained above, according to the first embodiment, a delay amount of the delay circuits can be variably controlled. Therefore, it is possible to prevent a functional operation failure due to inability to correctly acquire periodic data, an unnecessary fall in TDC resolution, and an increase in power consumption due to an increase in the number of delay stages.

Specific three operation examples concerning optimal value control for a delay amount are explained as embodiments below. In the ADPLL, various kinds of adjustment operation (calibration) are performed in an initial state such as a state at the start of operation. Optimum value control for a delay amount explained below including the optimum value control for a delay amount explained above can be carried as a part of the calibration.

Figure 4:
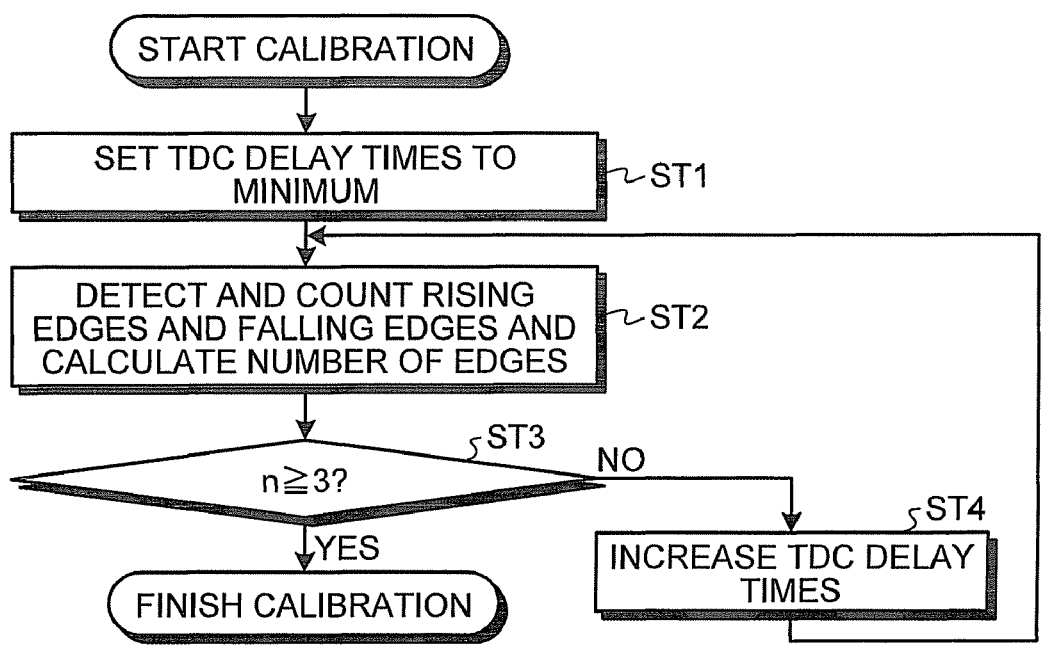
FIG. 4 is a flowchart for explaining delay amount control operation of a time to digital converter according to a second embodiment of the present invention.
Figure 5:
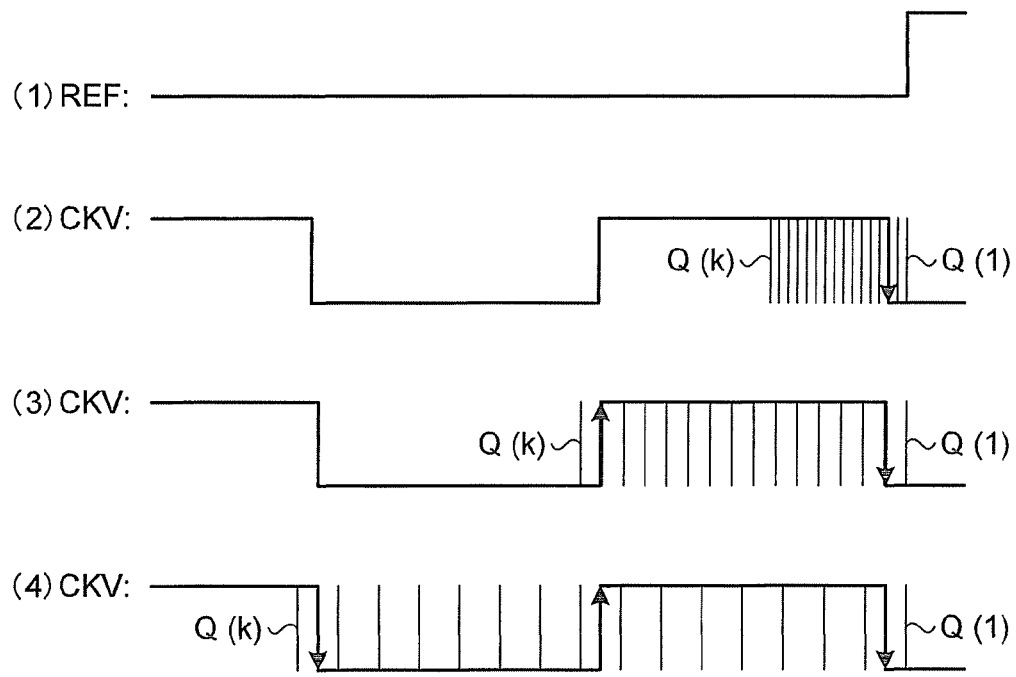
FIG. 5 is a timing chart for explaining an optimization process for delay time by a procedure shown in FIG. 4.

FIG. 4 is a flowchart for explaining delay amount control operation of a time to digital converter according to a second embodiment of the present invention. FIG. 5 is a timing chart for explaining an optimization process for delay time by a procedure shown in FIG. 4. In FIG. 5, a phase relation between the reference signal REF and the output CKV of the DCO 1, a relation between the output CKV of the DCO 1 and outputs of flip flops at certain delay time, and edge detecting operation are shown.

In the second embodiment, the edge detection/counter circuit 13a shown in FIG. 2 is set to detect and count, at the time of calibration, rising edges and falling edges of output signals of the flip flops 12-1 to 12-k. The control circuit 14 shown in FIG. 2 is set to monitor, at the time of calibration, the number of detected edges n to be three.

The reference signal REF and the output CKV of the DCO 1 shown in FIG. 2 are input, for example, in a phase relation shown in (1) of FIG. 5 and (2), (3), and (4) of FIG. 5. In FIG. 5, one clock period at the time when the reference signal REF is input immediately after the output CKV of the DCO 1 is switched from a high-level side half period to a low-level side half period is shown.

In FIGS. 4 and 5, first, the control circuit 14 sets, at the start of control operation, delay times of the variable delay circuits 11-1 to 11-k (TDC delay times) to a minimum (ST1). In this case, for example, as shown in (2) of FIG. 5, it is assumed that output signals Q(1) to Q(k) of the flip flops 12-1 to 12-k input to the edge detection/counter circuit 13a concentrate in a narrow range including a front end of a former half section in the high-level side half period of the output CKV of the DCO 1. The edge detection/counter circuit 13a detects the front end (a falling edge) of the high-level side half period of the output CKV of the DCO 1, sets the number of edges n to one, and outputs the number of edges n to the control circuit 14 (ST2).

The number of edges n detected at ST2 is one and is smaller than three ("No" at ST3). Therefore, the control circuit 14 determines that a delay amount is not enough and increases the delay times of the variable delay circuits 11-1 to 11-k (TDC delay times) by unit time (ST4). As a result, for example, as shown in (3) of FIG. 5, it is assumed that the output signals Q(1) to Q(k) of the flip flops 12-1 to 12-k input to the edge detection/counter circuit 13a spread to a range including the front end and a rear end of the high-level side half period of the output CKV of the DCO 1. The edge detection/counter circuit 13a detects the front end (the falling edge) and the rear end (a rising edge) of the high-level side half period of the output CKV of the DCO 1, sets the number of edges n to one, and outputs the number of edges n to the control circuit 14 (ST2).

The number of edges n detected at ST2 is two and is smaller than three again ("No" at ST3). Therefore, the control circuit 14 determines that a delay amount is not enough and increases the delay times of the variable delay circuits 11-1 to 11-k (TDC delay times) by unit time (ST4). As a result, for example, as shown in (4) of FIG. 5, it is assumed that the output signals Q(1) to Q(k) of the flip flops 12-1 to 12-k input to the edge detection/counter circuit 13a spread to a range including one period of the output CKV of the DCO 1. The edge detection/counter circuit 13a detects the front end (the falling edge) and the rear end (the rising edge) of the high-level side half period of the output CKV of the DCO 1, sets the number of edges n to three, and outputs the number of edges n to the control circuit 14 (ST2).

The number of edges n detected at ST2 is three this time ("Yes" at ST3). Therefore, the control circuit 14 ends the delay amount control and keeps a delay amount, with which the number of edges n=3 is obtained, as a set value. Thereafter, the TDC shown in FIG. 2 operates at the set TDC delay time.

According to the second embodiment, the delay amount, with which a sum of the number of rising edges and the number of falling edges is three, is the set value. Therefore, a right amount of data for one period can be acquired. Therefore, it is possible to cause the TDC to operate at highest resolution under a condition in which a functional operation failure does not occur.

Figure 6:
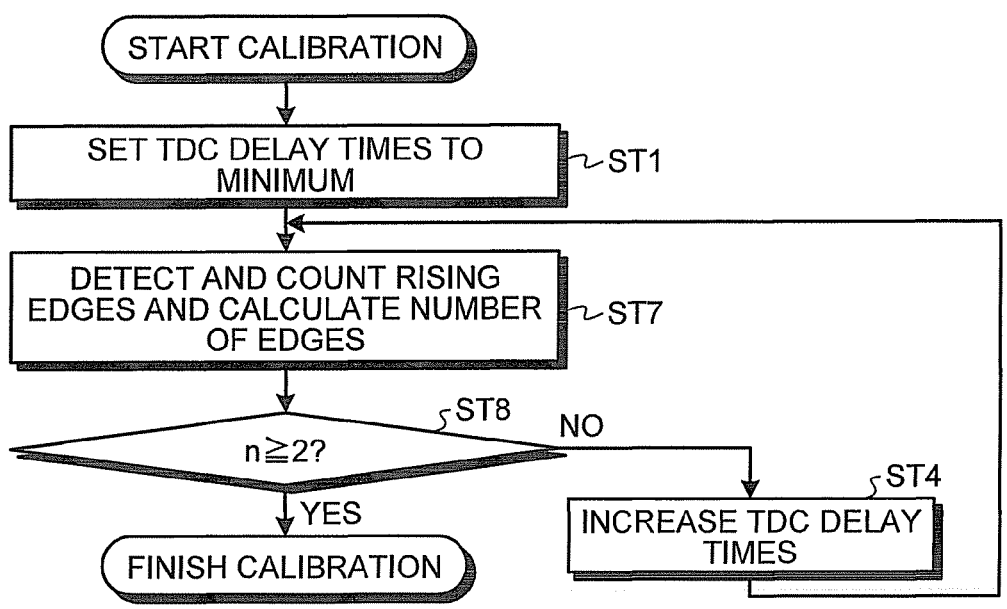
FIG. 6 is a flowchart for explaining delay amount control operation of a time to digital converter according to a third embodiment of the present invention.
Figure 7:
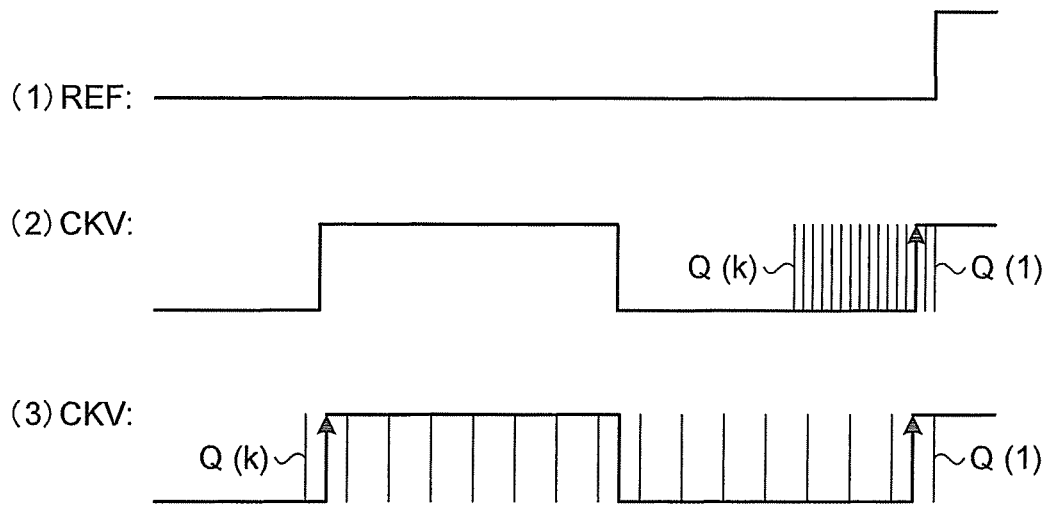
FIG. 7 is a timing chart for explaining an optimization process for delay time by a procedure shown in FIG. 6.

FIG. 6 is a flowchart for explaining delay amount control operation of a time to digital converter according to a third embodiment of the present invention. FIG. 7 is a timing chart for explaining an optimization process for delay time by a procedure shown in FIG. 6. In FIG. 7, as in FIG. 5, a phase relation between the reference signal REF and the output CKV of the DCO 1, a relation between the output CKV of the DCO 1 and outputs of flip flops at certain delay time, and edge detecting operation are shown.

In the third embodiment, the edge detection/counter circuit 13a shown in FIG. 2 is set to detect and count, at the time of calibration, one of rising edges and falling edges of output signals of the flip flops 12-1 to 12-k. In FIGS. 6 and 7, the edge detection/counter circuit 13a is set to detect and count the rising edges. The control circuit 14 shown in FIG. 2 is set to monitor, at the time of calibration, the number of detected edges n to be two.

The reference signal REF and the output CKV of the DCO 1 shown in FIG. 2 are input, for example, in a phase relation shown in (1) of FIG. 7 and (2) and (3) of FIG. 7. In FIG. 7, one clock period at the time when the reference signal REF is input immediately after the output CKV of the DCO 1 is switched from a low-level side half period to a high-level side half period is shown.

In FIGS. 6 and 7, first, the control circuit 14 sets, at the start of control operation, delay times of the variable delay circuits 11-1 to 11-$k$ (TDC delay times) to a minimum (ST1). In this case, for example, as shown in (2) of FIG. 7, it is assumed that output signals Q(1) to Q(k) of the flip flops 12-1 to 12-$k$ input to the edge detection/counter circuit 13$a$ concentrate in a narrow range including a front end of a former half section in the high-level side half period of the output CKV of the DCO 1. The edge detection/counter circuit 13$a$ detects the front end (a falling edge) of the high-level side half period of the output CKV of the DCO 1, sets the number of edges n to one, and outputs the number of edges n to the control circuit 14 (ST7).

The number of edges n detected at ST7 is one and is smaller than two ("No" at ST8). Therefore, the control circuit 14 determines that a delay amount is not enough and increases the delay times of the variable delay circuits 11-1 to 11-$k$ (TDC delay times) by unit time (ST4). As a result, for example, as shown in (3) of FIG. 7, it is assumed that the output signals Q(1) to Q(k) of the flip flops 12-1 to 12-$k$ input to the edge detection/counter circuit 13$a$ spread to a range including one period of the output CKV of the DCO 1. The edge detection/counter circuit 13$a$ detects a front end (a rising edge) of a low-level side half period and a rear end (a rising edge) of the high-level side half period of the output CKV of the DCO 1, sets the number of edges n to two, and outputs the number of edges n to the control circuit 14 (ST7).

The number of edges n detected at ST7 is two this time ("Yes" at ST8). Therefore, the control circuit 14 ends the delay amount control and keeps a delay amount, with which the number of edges n=2 is obtained, as a set value. Thereafter, the TDC shown in FIG. 2 operates at the set TDC delay time.

According to the third embodiment, the delay amount, with which a sum of the number of rising edges and the number of falling edges is two, is the set value. Therefore, a right amount of data for one period can be acquired. Therefore, as in the second embodiment, it is possible to cause the TDC to operate at highest resolution under a condition in which a functional operation failure does not occur.

In addition, in the third embodiment, compared with the second embodiment, it is likely that resolution is low depending on a condition. However, in the case of a configuration for carrying out only the third embodiment, it is possible to set the size of the edge detecting circuit/counter circuit smaller than that in the case of a configuration for carrying out only the second embodiment.

Figure 8:
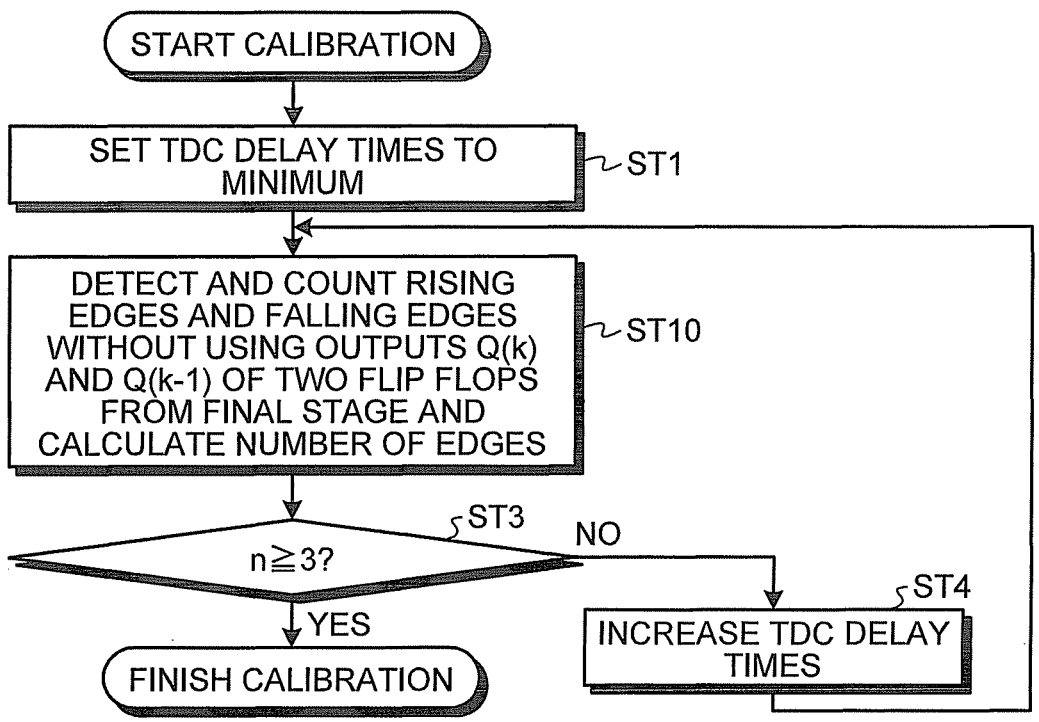
FIG. 8 is a flowchart for explaining delay time control operation of a time to digital converter according to a fourth embodiment of the present invention.

FIG. 8 is a flowchart for explaining delay amount control operation for a time to digital converter according to a fourth embodiment of the present invention. FIG. 9 is a timing chart for explaining an optimization process for delay time by a procedure shown in FIG. 8. In FIG. 9, as in FIG. 5, a phase relation between the reference signal REF and the output CKV of the DCO 1, a relation between the output CKV of the DCO 1 and outputs of flip flops at certain delay time, and edge detecting operation are shown.

In the fourth embodiment, the edge detection/counter circuit 13$a$ shown in FIG. 2 is set to detect and count, at the time of calibration, without using an output signal of at least one flip flop from the final stage of the flip flops 12-1 to 12-$k$, one or both of rising edges and falling edges of output signals of the remaining all flip flops.

In other words, the optimum value control for a delay amount explained in the first to third embodiments is carried out without setting the output signal of at least one flip flop from the final stage of the flip flops 12-1 to 12-$k$ as a target of edge detection and count.

However, in FIGS. 8 and 9, the edge detection/counter circuit 13$a$ is set to detect and count, without using output signals Q(k−1) and Q(k) of two flip flops 12-(k−1) and 12-$k$ from the final stage, both the rising edges and the falling edges using output signals Q(1) to Q(k−2) of the remaining flip flops. Therefore, the control circuit 14 shown in FIG. 2 is set to monitor, at the time of calibration, the number of detected edges n to be three.

The reference signal REF and the output CKV of the DCO 1 shown in FIG. 2 are input, for example, in a phase relation shown in (1) of FIG. 9 and (2), (3), and (4) of FIG. 9. In FIG. 7, the output CKV of the DCO 1 shown in (2), (3), and (4) of FIG. 9 has a waveform same as that shown in (2), (3), and (4) of FIG. 5. Q(k−1) and Q(k) indicated by broken lines in (2), (3), and (4) of FIG. 9 are output signals of a flip flop that is not set as a target of edge detection.

In FIGS. 8 and 9, first, the control circuit 14 sets, at the start of control operation, delay times of the variable delay circuits 11-1 to 11-$k$ (TDC delay times) to a minimum (ST1). In this case, for example, as shown in (2) of FIG. 9, it is assumed that output signals Q(1) to Q(k) of the flip flops 12-1 to 12-$k$ input to the edge detection/counter circuit 13$a$ concentrate in a narrow range including a front end of a former half section in the high-level side half period of the output CKV of the DCO 1. The edge detection/counter circuit 13$a$ detects, without using the output signals Q(k) and Q(k−1) of the two flip flops from the final stage of the flip flops 12-1 to 12-$k$, a front end (a falling edge) of the high-level side half period of the output CKV of the DCO 1 using the output signals Q(1) to Q(k−2) of the remaining flip flops, sets the number of edges n to one, and outputs the number of edges n to the control circuit 14 (ST10).

The number of edges n detected at ST10 is one and is smaller than three ("No" at ST3). Therefore, the control circuit 14 determines that a delay amount is not enough and increases the delay times of the variable delay circuits 11-1 to 11-$k$ (TDC delay times) by unit time (ST4). As a result, for example, as shown in (3) of FIG. 9, it is assumed that the output signals Q(1) to Q(k) of the flip flops 12-1 to 12-$k$ input to the edge detection/counter circuit 13$a$ spread to a range including one period of the output CKV of the DCO 1. The output signals Q(k) and Q(k−1) of the two flip flops from the final stage of the flip flops 12-1 to 12-$k$ are generated across a rear end of one period (a rear end of the low-level side half period) of the output CKV of the DCO 1.

Therefore, the edge detection/counter circuit 13$a$ does not perform edge detection at the rear end of one period (the rear end of the low-level side half period) of the output CKV of the DCO 1, detects the front end (the falling edge) and a rear end (a rising edge) of the high-level side half period of the output CKV of the DCO 1, sets the number of edges n to two, and outputs the number of edges n to the control circuit 14 (ST10).

The number of edges n detected at ST10 is two and is smaller than three again ("No" at ST3). Therefore, the control circuit 14 determines that a delay amount is not enough and increases the delay times of the variable delay circuits 11-1 to 11-$k$ (TDC delay times) by unit time (ST4). As a result, for example, as shown in (4) of FIG. 9, it is assumed that the output signals Q(1) to Q(k) of the flip flops 12-1 to 12-$k$ input to the edge detection/counter circuit 13$a$ spread to a range including one period of the output CKV of the DCO 1 while both the two output signals Q(k) and Q(k−1) from the final stage exceed the rear end of one period of the output CKV of the DCO 1. In the example shown in the figure, output signals Q(k−3) and Q(k−2) of the flip flops 12-(k−3) and 12-(k−2) are generated across the rear end of the low-level side half period.

Consequently, the edge detection/counter circuit 13a can detect even the rear end of the low-level side half period that is the rear end of one period of the output CKV of the DCO 1. Therefore, the edge detection/counter circuit 13a detects the front end (the falling edge) and the rear end (the rising edge) of the high-level side half period and the rear end (a falling edge) of the low-level side half period of the output CKV of the DCO 1, sets the number of edges n to three, and outputs the number of edges to the control circuit 14 (ST10).

The number of edges detected at ST10 is three this time ("Yes" at ST3). Therefore, the control circuit 14 ends the delay amount control and keeps a delay amount, with which the edge number n=3 is obtained, as a set value. Thereafter, the TDC shown in FIG. 2 operate at the set TDC delay time.

According to the fourth embodiment, the optimum value control for a delay amount can be performed with the number of outputs smaller than the number of outputs of all the flip flops. Therefore, it is possible to prevent a functional operation failure of the TDC even when a delay amount changes because of fluctuation or the like and when an output frequency of the DCO 1 changes.

In FIG. 2, all the delay stages of the delay circuits are configured as the variable delay stages. However, at last one variable delay stage can be provided. The optimum value control can be performed even if the delay circuits are configured in this way.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A time to digital converter comprising:
   a delay circuit having a plurality of delay stages configured to delay an input clock signal in multiple stages, at least one of the plurality of delay stages being a variable delay stage;
   a plurality of flip flops that are provided in a number same as a number of the plurality of delay stages of the delay circuit and that are configured to capture outputs of the plurality of delay stages corresponding thereto in parallel in response to input of a reference signal which is different from the input clock signal in phase;
   an edge detecting circuit configured to detect one or both of rising edges and falling edges of respective outputs of the plurality of flip flops;
   a counter circuit configured to count a number of edges detected by the edge detecting circuit;
   a control circuit configured to control a delay amount of the variable delay stage according to the number of edges counted by the counter circuit; and
   a digital-code generating circuit configured to convert, based on a detection output of the edge detecting circuit, a decimal fraction phase difference between a period of the input clock signal and the reference signal into a digital code.

2. The time to digital converter according to claim 1, wherein the edge detecting circuit is configured to detect both of the rising edges and the falling edges of the respective outputs of the plurality of flip flops, and the control circuit is configured to perform control for increasing the delay amount of the variable delay stage in response to a determination that the number of edges counted by the counter circuit is smaller than three, and to perform control for reducing the delay amount of the variable delay stage in response to a determination that the number of edges counted by the counter circuit is equal to or larger than three.

3. The time to digital converter according to claim 1, wherein the edge detecting circuit is configured to detect both of the rising edges and the falling edges of the respective outputs of the plurality of flip flops, and the control circuit is configured to set the delay amount of the variable delay stage to a minimum at a start of operation, and to perform control for increasing the delay amount of the variable delay stage until the number of edges counted by the counter circuit reaches three.

4. The time to digital converter according to claim 1, wherein the edge detecting circuit is configured to detect one of the rising edges and the falling edges of the respective outputs of the plurality of flip flops, and the control circuit is configured to set the delay amount of the variable delay stage to a minimum at a start of operation, and to perform control for increasing the delay amount of the variable delay stage until the number of edges counted by the counter circuit reaches two.

5. The time to digital converter according to claim 1, wherein the variable delay stage of the delay circuit includes:
   a first variable current source, wherein one end of the first variable current source is connected to a circuit power supply;
   a second variable current source, wherein one end of the second variable current source is connected to a circuit ground; and
   a complementary metal oxide semiconductor (CMOS) inverter circuit including a p-channel metal oxide semiconductor (PMOS) transistor and an n-channel metal oxide semiconductor (NMOS) transistor, gates of which are connected in common to form an input terminal and drains of which are connected in common to form an output terminal, a source of the PMOS transistor being connected to one end of a first variable delay stage and a source of the NMOS transistor being connected to one end of a second variable delay stage, and the first variable current source and the second variable current source are configured to respectively supply working currents corresponding to a delay amount control signal from the control circuit to the CMOS inverter circuit.

6. The time to digital converter according to claim 1, wherein the input clock signal is an output signal of a digital control oscillator.

7. A time to digital converter comprising:
   a delay circuit having a plurality of delay stages configured to delay an input clock signal in multiple stages, at least one of the plurality of delay stages being a variable delay stage;
   a plurality of flip flops that are provided in a number same as a number of the plurality of delay stages of the delay circuit and that are configured to capture outputs of the plurality of delay stages corresponding thereto in parallel in response to input of a reference signal which is different from the input clock signal in phase;
   an edge detecting circuit configured to detect, without using an output signal of at least one flip flop from a final stage of the plurality of flip flops, one or both of rising edges and falling edges of respective outputs of the remaining flip flops of the plurality of flip flops;
   a counter circuit configured to count a number of edges detected by the edge detecting circuit;

a control circuit configured to control a delay amount of the variable delay stage according to the number of edges counted by the counter circuit; and a digital-code generating circuit configured to convert, based on a detection output of the edge detecting circuit, a decimal fraction phase difference between a period of the input clock signal and the reference signal into a digital code.

8. The time to digital converter according to claim 7, wherein the edge detecting circuit is configured to detect both of the rising edges and the falling edges of respective outputs of the plurality of flip flops, and the control circuit is configured to perform control for increasing the delay amount of the variable delay stage in response to a determination that the number of edges counted by the counter circuit is smaller than three, and to perform control for reducing the delay amount of the variable delay stage in response to a determination that the number of edges counted by the counter circuit is equal to or larger than three.

9. The time to digital converter according to claim 7, wherein the edge detecting circuit is configured to detect both of the rising edges and the falling edges of respective outputs of the plurality of flip flops, and the control circuit is configured to set the delay amount of the variable delay stage to a minimum at a start of operation, and to perform control for increasing the delay amount of the variable delay stage until the number of edges counted by the counter circuit reaches three.

10. The time to digital converter according to claim 7, wherein the edge detecting circuit is configured to detect one of the rising edges and the falling edges of respective outputs of the plurality of flip flops, and the control circuit is configured to set the delay amount of the variable delay stage to a minimum at a start of operation, and to perform control for increasing the delay amount of the variable delay stage until the number of edges counted by the counter circuit reaches two.

11. The time to digital converter according to claim 7, wherein the variable delay stage of the delay circuit includes:

a first variable current source, wherein one end of the first variable current source is connected to a circuit power supply;

a second variable current source, wherein one end of the second variable current source is connected to a circuit ground; and a complementary metal oxide semiconductor (CMOS) inverter circuit including a p-channel metal oxide semiconductor (PMOS) transistor and an n-channel metal oxide semiconductor (NMOS) transistor, gates of which are connected in common to form an input terminal and drains of which are connected in common to form an output terminal, a source of the PMOS transistor being connected to one end of a first variable delay stage and a source of the NMOS transistor being connected to one end of a second variable delay stage, and the first variable current source and the second variable current source are configured to respectively supply working currents corresponding to a delay amount control signal from the control circuit to the CMOS inverter circuit.

12. The time to digital converter according to claim 7, wherein the input clock signal is an output signal of a digital control oscillator.

* * * * *